(12) United States Patent
Naito (10) Patent No.: US 10,840,361 B2
(45) Date of Patent: Nov. 17, 2020

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/045,744

(22) Filed: Jul. 26, 2018

(65) Prior Publication Data

US 2018/0350962 A1 Dec. 6, 2018

Related U.S. Application Data

(63) Continuation of application No. PCT/JP2017/028853, filed on Aug. 8, 2017.

(30) Foreign Application Priority Data

Aug. 12, 2016 (JP) .................. 2016-158694

(51) Int. Cl.
*H01L 29/739* (2006.01)
*H01L 29/417* (2006.01)
(Continued)

(52) U.S. Cl.
CPC ........ *H01L 29/7397* (2013.01); *H01L 21/263* (2013.01); *H01L 21/3003* (2013.01);
(Continued)

(58) Field of Classification Search
None
See application file for complete search history.

(56) References Cited

U.S. PATENT DOCUMENTS

2007/0267663 A1* 11/2007 Harada ............... H01L 29/0834
257/288
2008/0197379 A1 8/2008 Aono
(Continued)

FOREIGN PATENT DOCUMENTS

JP         S6419771 A      1/1989
JP         2001127286 A    5/2001
(Continued)

OTHER PUBLICATIONS

Office Action issued for counterpart Japanese Application No. 2018-533524, drafted by the Japan Patent Office dated Aug. 9, 2019.
(Continued)

*Primary Examiner* — Steven M Christopher (57) ABSTRACT

There is provided a semiconductor device comprising: a semiconductor substrate; an emitter region of a first conductivity type provided inside the semiconductor substrate; a base region of a second conductivity type provided below the emitter region inside the semiconductor substrate; an accumulation region of the first conductivity type provided below the base region inside the semiconductor substrate, and containing hydrogen as an impurity; and a trench portion provided to pass through the emitter region, the base region and the accumulation region from an upper surface of the semiconductor substrate.

14 Claims, 10 Drawing Sheets

(51) Int. Cl.
  *H01L 21/76* (2006.01)
  *H01L 29/32* (2006.01)
  *H01L 29/36* (2006.01)
  *H01L 29/861* (2006.01)
  *H01L 21/263* (2006.01)
  *H01L 21/30* (2006.01)
  *H01L 21/322* (2006.01)
  *H01L 21/324* (2006.01)
  *H01L 29/08* (2006.01)
  *H01L 29/10* (2006.01)
  *H01L 29/66* (2006.01)
  *H01L 21/265* (2006.01)

(52) U.S. Cl.
  CPC ........ *H01L 21/324* (2013.01); *H01L 21/3223* (2013.01); *H01L 21/3225* (2013.01); *H01L 21/76* (2013.01); *H01L 29/0804* (2013.01); *H01L 29/0834* (2013.01); *H01L 29/0847* (2013.01); *H01L 29/105* (2013.01); *H01L 29/1037* (2013.01); *H01L 29/32* (2013.01); *H01L 29/36* (2013.01); *H01L 29/417* (2013.01); *H01L 29/66348* (2013.01); *H01L 29/739* (2013.01); *H01L 29/8613* (2013.01); *H01L 21/26506* (2013.01)

(56) References Cited

U.S. PATENT DOCUMENTS

| | | | |
|---|---|---|---|
| 2013/0075783 A1* | 3/2013 | Yamazaki | H01L 21/263 257/139 |
| 2014/0299915 A1* | 10/2014 | Kouno | H01L 21/263 257/139 |
| 2016/0351561 A1* | 12/2016 | Senoo | H01L 29/872 |
| 2017/0018434 A1 | 1/2017 | Onozawa | |
| 2017/0025410 A1 | 1/2017 | Cheng | |

FOREIGN PATENT DOCUMENTS

| | | |
|---|---|---|
| JP | 2007311627 A | 11/2007 |
| JP | 2008078397 A | 4/2008 |
| JP | 2008205015 A | 9/2008 |
| JP | 2013138172 A | 7/2013 |
| JP | 2014007254 A | 1/2014 |
| JP | 2015135954 A | 7/2015 |
| WO | 2016051970 A1 | 4/2016 |

OTHER PUBLICATIONS

International Search Report for International Patent Application No. PCT/JP2017/028853, issued by the Japan Patent Office dated Oct. 31, 2017.

Office Action issued for counterpart Japanese Application No. 2018-533524, issued by the Japanese Patent Office dated Mar. 3, 2020 (drafted on Feb. 27, 2020).

* cited by examiner

SEMICONDUCTOR DEVICE AND MANUFACTURING METHOD OF SEMICONDUCTOR DEVICE

The contents of the following Japanese patent application(s) are incorporated herein by reference:
NO. 2016-158694 filed in JP on Aug. 12, 2016, and
NO. PCT/JP2017/028853 filed on Aug. 8, 2017.

BACKGROUND

1. Technical Field

The present invention relates to a semiconductor device and a manufacturing method of the semiconductor device.

2. Related Art

Conventionally, for semiconductor device such as insulated gate bipolar transistors (IGBTs), a structure has been known in which an accumulation region for accumulating carriers is formed below a p type base region (for example, refer to Patent Documents 1 and 2). The ON voltage of the semiconductor device is reduced by accumulation of carriers.

Patent document 1: Japanese Patent Application Publication No. 2007-311627
Patent document 2 Japanese Patent Application Publication No. 2014-7254

When an accumulation region is formed at a relatively deep position by implantation of impurities such as phosphorous, variations in position and width of the accumulation region occur easily in a depth direction of a semiconductor substrate. The occurrence of the variations in position and width of the accumulation region may have an effect on the doping concentration distribution in the base region to vary a threshold value of the semiconductor device.

SUMMARY

In a first aspect of the present invention, a semiconductor device comprising a semiconductor substrate is provided. The semiconductor device may comprise an emitter region of a first conductivity type provided inside the semiconductor substrate. The semiconductor device may comprise a base region of a second conductivity type provided below the emitter region inside the semiconductor substrate. The semiconductor device may comprise an accumulation region of the first conductivity type provided below the base region inside the semiconductor substrate, and containing hydrogen as an impurity. The semiconductor device may comprise a trench portion provided to pass through the emitter region, the base region and the accumulation region from an upper surface of the semiconductor substrate.

The base region may contain hydrogen. The concentration distribution of hydrogen in the depth direction of the semiconductor substrate may have peaks in both of the base region and the accumulation region.

A peak value of the hydrogen concentration distribution in the accumulation region may be higher than a peak value of the hydrogen concentration distribution in the base region. In the depth direction of the semiconductor substrate, a peak position of a doping concentration distribution in the base region may match with a peak position of the hydrogen concentration distribution in the base region.

The peak value of the hydrogen concentration distribution in the base region may be higher than the peak value of the doping concentration distribution in the base region. The semiconductor device may comprise a drift region of the first conductivity type provided below the accumulation region inside the semiconductor substrate, and having a lower doping concentration lower than the emitter region. The peak value of the hydrogen concentration distribution in the base region may be higher than the doping concentration in the drift region.

The semiconductor device may comprise, inside the semiconductor substrate, an intermediate region having a lower doping concentration lower than the accumulation region between the base region and the accumulation region. The semiconductor device may comprise an interlayer dielectric film provided to cover the above trench portion on the upper surface of the semiconductor substrate. The semiconductor device may comprise a barrier metal provided on the entire upper surface of the interlayer dielectric film above the trench portion.

In a second aspect of the present invention, there is provided a semiconductor device including a manufacturing method of a semiconductor device. The manufacturing method may further comprise, in an upper surface side of a semiconductor substrate, an impurity region formation step of forming an emitter region of a first conductivity type, and a base region of a second conductivity type provided below the emitter region. The manufacturing method may comprise a proton implantation step of forming an accumulation region of the first conductivity type provided below the base region and containing hydrogen as an impurity by implantation of protons from the upper surface of the semiconductor substrate.

The manufacturing method may comprise, between the impurity region formation step and the proton implantation step, a trench formation step of forming a trench portion that passes through the emitter region and the base region from the upper surface of the semiconductor substrate. The manufacturing method may comprise, between the impurity region formation step and the proton implantation step, an interlayer dielectric film formation step of forming an interlayer dielectric film to cover the trench portion on the upper surface of the semiconductor substrate. The manufacturing method may comprise, between the impurity region formation step and the proton implantation step, a barrier metal formation step of forming a barrier metal on the entire upper surface of the interlayer dielectric film above the trench portion.

The summary clause of the above invention does not necessarily describe all necessary features of the present invention. The present invention may also be a sub-combination of the features described above.

DESCRIPTION OF EXEMPLARY EMBODIMENTS

Hereinafter, the present invention will be described through embodiments of the present invention will be described. However, the following embodiments do not limit the invention according to the claims. In addition, all the combinations of the features described in the embodiments are not necessarily essential to means provided by aspects of the invention.

In this specification, one side in a direction parallel to a depth direction of a semiconductor substrate is referred to as an "upper" side, and the other side is referred to as a "lower" side. One surface of two principal surfaces of a substrate, a layer or another member is referred to as an upper surface, and the other surface is referred to as a lower surface. The "upper" and "lower" directions are not limited to the gravitational direction. Although each embodiment shows an example in which a first conductivity type and a second conductivity type are taken as an n type and a p type, respectively, the conductivity types of the substrate, layer, region, or the like each may be of reverse polarity.

Figure 1:
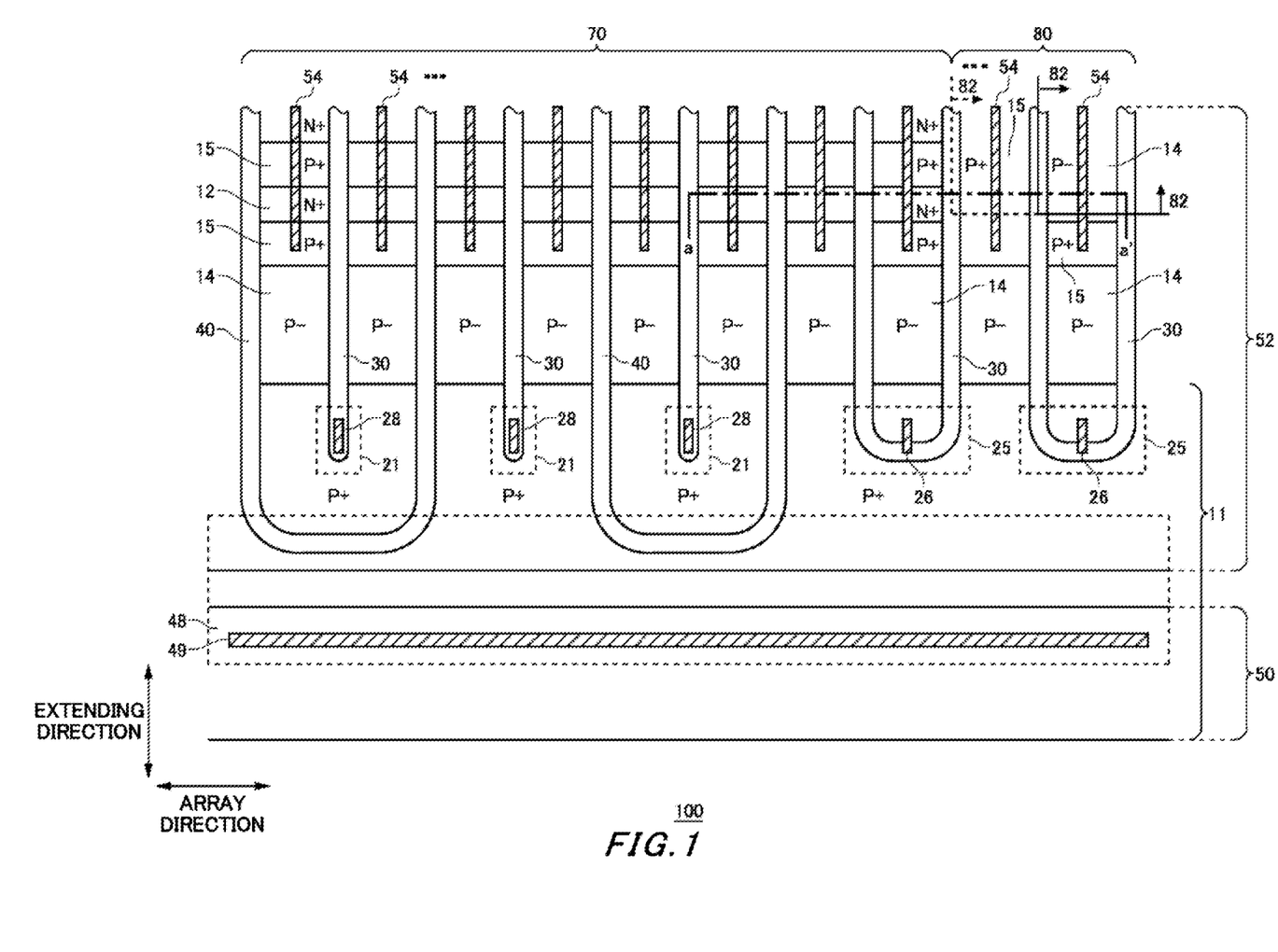
FIG. 1 is a drawing showing a part of an upper surface of a semiconductor device 100 according to an embodiment of the present invention.

FIG. 1 is a drawing showing a part of an upper surface of a semiconductor device 100 according to an embodiment of the present invention. The semiconductor device 100 of the present example is a semiconductor chip including a transistor section 70 which includes a transistor such as an IGBT and a diode section 80 which includes a diode such as an FWD (Free Wheel Diode). The diode section 80 is formed to be adjacent to the transistor section 70 in an upper surface of a semiconductor substrate. In FIG. 1, an upper surface of the chip around a chip end portion is shown, and other regions are omitted.

Also, while FIG. 1 shows an active region of the semiconductor substrate in the semiconductor device 100, the semiconductor device 100 may have an edge termination structure section to surround the active region. The active region refers to a region in which current flows when the semiconductor device 100 is controlled to be in an ON state. The edge termination structure section relaxes an electric field concentration at an upper surface side of the semiconductor substrate. The edge termination structure section has a structure of, for example, a guard ring, a field plate, an RESURF, or a combination thereof.

The semiconductor device 100 of the present example comprises a gate trench portion 40, a dummy trench portion 30, a well region 11, an emitter region 12, a base region 14 and a contact region 15 that are formed inside the upper surface side of the semiconductor substrate. Also, the semiconductor device 100 of the present example also comprises an emitter electrode 52 and a gate metal layer 50 provided above the upper surface of the semiconductor substrate. The emitter electrode 52 and the gate metal layer 50 are provided to be separated from each other. The gate trench portion 40 and the dummy trench portion 30 are one example of the trench portion.

An interlayer dielectric film is formed between the emitter electrode 52 and the gate metal layer 50, and the upper surface of the semiconductor substrate, but is omitted from FIG. 1. In the interlayer dielectric film of the present example, a contact hole 26, a contact hole 28, a contact hole 49 and a contact hole 54 are formed to pass through the interlayer dielectric film.

The emitter electrode 52 is in contact with the emitter region 12, the contact region 15 and the base region 14 on the upper surface of the semiconductor substrate through the contact hole 54. Also, the emitter electrode 52 is connected to a dummy conductive portion within the dummy trench portion 30 through the contact hole 26 and the contact hole 28. A connection section 21 and a connection section 25 formed of a conductive material such as polysilicon doped with impurities may be provided between the emitter electrode 52 and the dummy conductive portion. The connection section 21 and the connection section 25 are formed in the upper surface of the semiconductor substrate. The connection section 21 and the connection section 25 are insulated from the semiconductor substrate with an insulating film such as oxide film.

The gate metal layer 50 is in contact with the gate runner 48 through the contact hole 49. The gate runner 48 is formed of polysilicon doped with impurities, or the like. The gate runner 48 is connected to a gate conductive portion inside the gate trench portion 40 at the upper surface of the semiconductor substrate. The gate runner 48 is not connected to the dummy conductive portion in the dummy trench portion 30. The gate runner 48 of the present example is formed from below the contact hole 49 to an edge portion of the gate trench portion 40. The gate runner 48 is insulated from the semiconductor substrate with an insulating film such as an oxide film. At the edge portion of the gate trench portion 40, the gate conductive portion is exposed to the upper surface of the semiconductor substrate and is in contact with the gate runner 48.

The emitter electrode 52 and the gate metal layer 50 are formed of a metal-containing material. For example, at least a partial region of each electrode is formed of aluminum or an aluminum-silicon alloy. Each electrode may have a barrier metal formed of titanium, a titanium compound or the like in an lower layer of a region formed of aluminum or the like, and may include a plug formed of tungsten or the like inside the contact hole.

One or more gate trench portions 40 and one or more dummy trench portions 30 are arrayed at a predetermined interval along a predetermined array direction in a region of the transistor section 70. In the transistor section 70, one or more gate trench portions 40 and one or more dummy trench portions 30 may be formed alternately along the array direction.

The gate trench portion 40 of the present example may have two extending portions that extend along an extending direction perpendicular to the array direction, and a connecting portion that connects the two extending portions. At least a part of the connecting portion is preferably formed in a curved shape. When the end portions of the two extending portions of the gate trench portion 40 are connected to each other, the electric field concentration at the end portions of the extending portions can be relaxed. The gate runner 48 may be connected to the gate conductive portion at the connecting portion of the gate trench portion 40.

The dummy trench portion 30 of the present example is provided between the independent extending portions of the gate trench portion 40. These dummy trench portions 30 may have a straight shape to extend in the extending direction.

Note that in the transistor section 70, a plurality of dummy trench portions 30 may be arrayed in series at a boundary with the diode section 80. The dummy trench portion 30 formed at the boundary portion may also have the extending portions and the connecting portion. The dummy trench portion 30 having the connecting portion and the dummy trench portion 30 in a straight shape may have the same length in the extending direction.

The number of dummy trench portions 30 arrayed in series at the boundary with the diode section 80 in the transistor section 70 may be greater than the number of dummy trench portions 30 arrayed in series inside the transistor section 70 away from the diode section 80. Note that the number of trench portions refers to the number of extending portions of the trench portions arrayed in the array direction.

In the example of FIG. 1, in the transistor section 70 at the boundary with the diode section 80, two dummy trench portions 30 are arrayed in series. On the other hand, inside the transistor section 70, the gate trench portions 40 and the dummy trench portions 30 are arrayed alternately one by one.

The emitter electrode 52 is formed above the gate trench portion 40, the dummy trench portion 30, the well region 11, the emitter region 12, the base region 14 and the contact region 15. The well region 11 is formed within a predetermined range from an end portion of the active region at the side provided with the gate metal layer 50. A diffusion depth of the well region 11 may be greater than a depth of the gate trench portion 40 and the dummy trench portion 30. Some regions of the gate trench portion 40 and the dummy trench portion 30 at the side of the gate metal layer 50 are formed in the well region 11. A bottom of an end of the dummy trench portion 30 in the extending direction may be covered with the well region 11.

The base region 14 is formed in a mesa portion sandwiched between the independent trench portions. The base region 14 is of the second conductivity type and has a doping concentration lower than the well region 11. The base region 14 of the present example is of P− type. The well region is of the second conductivity type and of P+ type.

The contact region 15 of the second conductivity type having a higher doping concentration higher than the base region 14 is formed on the upper surface of the base region 14 in the mesa portion. The contact region 15 of the present example is of P+ type. Also, in the transistor section 70, the emitter region 12 of the first conductivity type having a higher doping concentration than the semiconductor substrate is selectively formed on a part of an upper surface of the contact region 15. The emitter region 12 of the present example is of N+ type.

Each of the contact region 15 and the emitter region 12 is formed to extend from one of the adjacent trench portions to the other. One or more contact regions 15 and one or more emitter regions 12 of the transistor section 70 are formed to be exposed to an upper surface of the mesa portion alternately along the extending direction of the trench portion.

In another example, in the mesa portion of the transistor section 70, the contact regions 15 and the emitter regions 12 may also be formed in a striped pattern along the extending direction. For example, the emitter region 12 is formed in a region adjacent to the trench portion and the contact region 15 is formed in a region sandwiched between the emitter regions 12.

The emitter region 12 is not formed in the mesa portion of the diode section 80. Also, in the mesa portion of the diode section 80, the contact region 15 is formed in a region opposed to at least one contact region 15 in the transistor section 70. Note that in a place where the mesa portion of the diode section 80 adjacent to the transistor section 70 is projected to the lower surface of the semiconductor substrate, a cathode region 82 may be formed, or a collector region 22 of the transistor section 70 may be formed to be extended thereto.

In the transistor section 70, the contact hole 54 is formed above each region of the contact region 15 and the emitter region 12. The contact hole 54 is not formed in a region that corresponds to the base region 14 and the well region 11.

In the diode section 80, the contact hole 54 is formed above the contact region 15 and the base region 14. The contact hole 54 of the present example is not formed in the base region 14 closest to the gate metal layer 50, among a plurality of base regions 14 in the mesa portion of the diode section 80. In the present example, the contact hole 54 of the transistor section 70 and the contact hole 54 of the diode section 80 have the same length in the extending direction of each trench portion.

Figure 2:
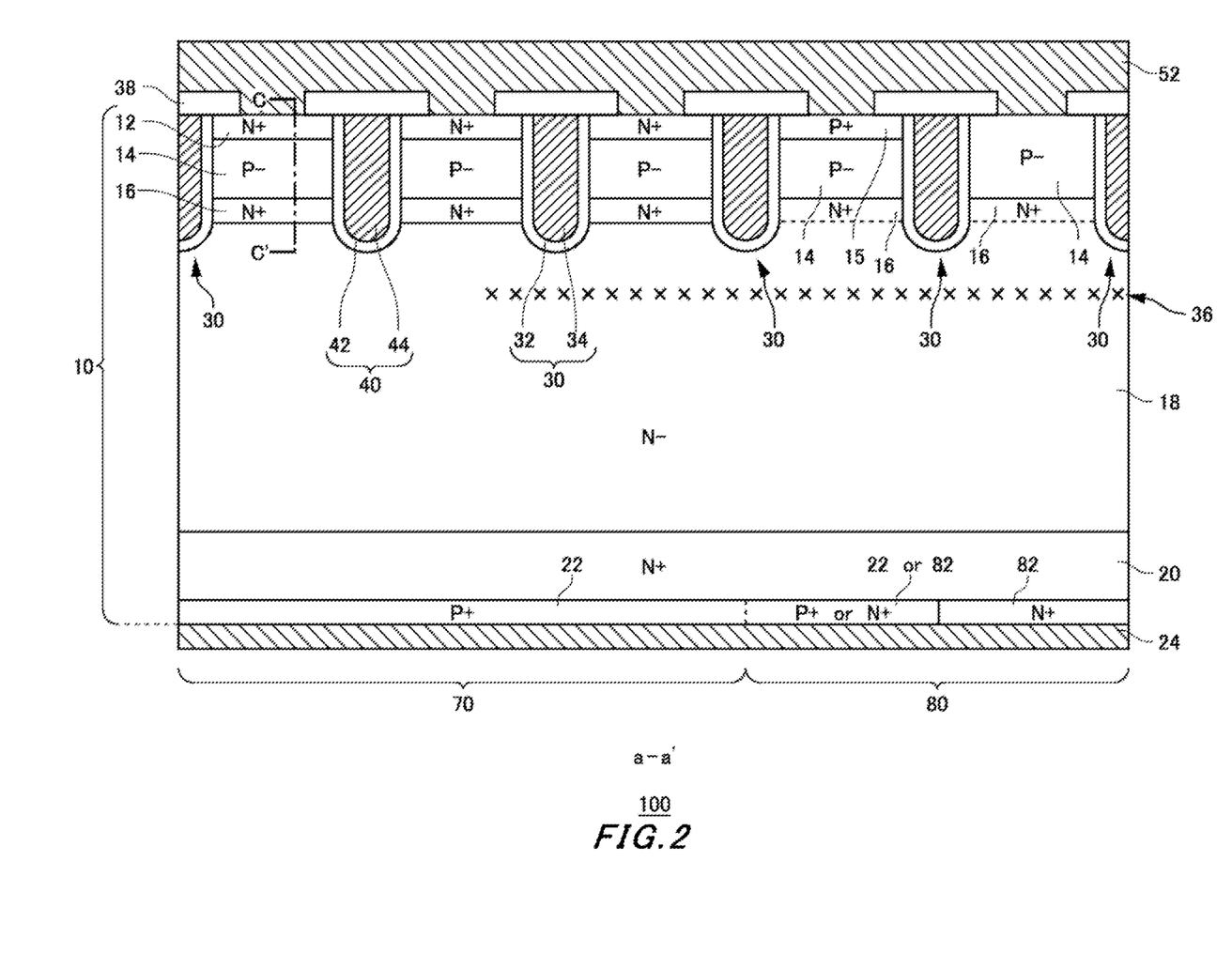
FIG. 2 is a drawing showing one example in a cross-section a-a' in FIG. 1.

FIG. 2 is a drawing showing one example of a cross-section a-a' in FIG. 1. The semiconductor device 100 of the present example has, in the cross-section, a semiconductor substrate 10, an interlayer dielectric film 38, the emitter electrode 52 and a collector electrode 24. The emitter electrode 52 is formed on the upper surface of the semiconductor substrate 10 and the interlayer dielectric film 38.

The collector electrode 24 is formed on the lower surface of the semiconductor substrate 10. The emitter electrode 52 and the collector electrode 24 are formed of a conductive material such as metal. In this specification, a direction that connects the emitter electrode 52 to the collector electrode 24 is referred to as a depth direction.

The semiconductor substrate 10 may be a silicon substrate, may be a silicon carbide substrate, or may be a nitride semiconductor substrate such as gallium nitride, or the like. The semiconductor substrate 10 of the present example is a silicon substrate. The base region 14 of P− type is formed in the upper surface side of the semiconductor substrate 10.

In the cross-section, in the upper surface side of the transistor section 70, the emitter region 12 of N+ type, the base region 14 of P− type and the accumulation region 16 of N+ type are formed in order from the upper surface side of the semiconductor substrate 10.

In the cross-section, the base region 14 of P− type is formed in the upper surface side of the diode section 80. The accumulation region 16 is not formed in the diode section 80. Also, the contact region 15 is formed in the upper surface of a mesa portion adjacent to the transistor section 70.

In the transistor section 70, the drift region 18 of N− type is formed on the lower surface of the accumulation region 16. The accumulation region 16 having a higher concentration than the drift region 18 can be provided between the drift region 18 and the base region 14, thereby increasing a carrier injection-enhancement effect (IE effect) and reducing an ON voltage.

The accumulation region 16 is formed in each mesa portion of the transistor section 70. The accumulation region 16 may be provided to cover the entire lower surface of the base region 14 in each mesa portion. In the diode section 80, the drift region 18 is formed on the lower surface of the base region 14. In both of the transistor section 70 and the diode section 80, a buffer region 20 of N+ type is formed on the lower surface of the drift region 18.

The buffer region 20 is formed on the lower surface side of the drift region 18. A doping concentration of the buffer region 20 is higher than a doping concentration of the drift region 18. The buffer region 20 may work as a field stop layer to prevent a depletion layer expanded from the lower surface side of the base region 14 from reaching the collector region 22 of P+ type and the cathode region 82 of N+ type.

In the transistor section 70, the collector region 22 of P+ type is formed in the lower surface of the buffer region 20. In the diode section 80, the cathode region 82 of N+ type is formed on the lower surface of the buffer region 20.

One or more gate trench portions 40 and one or more dummy trench portions 30 are formed in the upper surface side of the semiconductor substrate 10. Each trench portion passes through the base region 14 from the upper surface of the semiconductor substrate 10 to reach the drift region 18. For regions provided with at least any one of the emitter region 12, the contact region 15 and the accumulation region 16, each trench portion also passes through these regions to reach the drift region 18. The configuration in which the trench portion passes through the impurity region is not limited to the one manufactured in an order of formation of the trench portion after formation of the impurity region. A configuration by formation of the impurity region between the trench portions after the formation of the trench portion is included in the one in which the trench portion passes through the impurity region.

The gate trench portion 40 has a gate trench, a gate insulating film 42 and a gate conductive portion 44 formed in the upper surface side of the semiconductor substrate 10. The gate insulating film 42 is formed to cover an inner wall of the gate trench. The gate insulating film 42 may be formed by oxidizing or nitriding semiconductors on the inner wall of the gate trench. The gate conductive portion 44 is formed inside the gate trench in a more inner side than the gate insulating film 42. That is, the gate insulating film 42 insulates the gate conductive portion 44 from the semiconductor substrate 10. The gate conductive portion 44 is formed of a conductive material such as polysilicon.

The gate conductive portion 44 includes at least a region opposed to the adjacent base region 14 in the array direction. The gate trench portion 40 in the cross-section is covered by the interlayer dielectric film 38 on the upper surface of the semiconductor substrate 10. When a predetermined voltage is applied to the gate conductive portion 44, a channel is formed in a surface layer at an interface of the base region 14 that contacts the gate trench.

The dummy trench portion 30 may have the same structure as that of the gate trench portion 40 in the cross-section. The dummy trench portion 30 includes a dummy trench, a dummy insulating film 32 and a dummy conductive portion 34 formed in the upper surface side of the semiconductor substrate 10. The dummy insulating film 32 is formed to cover an inner wall of the dummy trench. The dummy conductive portion 34 is formed inside the dummy trench and formed in a more inner side than the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have the same length in the depth direction as that of the gate conductive portion 44. The dummy trench portion 30 in the cross-section is covered with the interlayer dielectric film 38 on the upper surface of the semiconductor substrate 10.

The accumulation region 16 contains hydrogen as an impurity. Hydrogen as the impurity refers to hydrogen transformed to donors. Impurities other than hydrogen may be contained in the accumulation region 16. Note that among the impurities contained in the accumulation region 16, the impurity of the highest concentration is hydrogen.

The accumulation region 16 can be formed such that protons (hydrogen ions) are implanted from the upper surface or the lower surface of the semiconductor substrate 10 to be activated. As compared to phosphorous ions or the like, protons can be easily implanted to a deeper position, and also variations of the implanted position are smaller. For this reason, with the accumulation region 16 containing hydrogen as the impurity, a relative position with the base region 14 and a width in the depth direction can be controlled with high precision, so that variations in the threshold value of the semiconductor device 100 can be suppressed. The emitter region 12 may contain phosphorous as the impurity. The emitter region 12 may further contain hydrogen having a lower concentration than that of phosphorous.

The accumulation region 16 may be formed only in the transistor section 70, and may be formed in both of the transistor section 70 and the diode section 80. In the present example, it is formed only in the transistor section 70. Note that in FIG. 2, the accumulation region 16 is shown by a dotted line when formed in the diode section 80. If the accumulation region 16 is also formed in the diode section 80, minority carriers can be suppressed from being excessively injected from the base region 14 when the diode section performs on-operation.

In the lower surface side of the dummy trench portion 30 in the diode section 80, a lifetime killer 36 may be introduced closer to the upper surface than the center of the drift region 18 in the depth direction. The lifetime killer 36 may comprise a peak concentration in a more lower surface side than the position of the peak concentration of the hydrogen introduced by the proton implantation. The lifetime killer 36 is a recombination center, which may be a crystal defect, and may be a vacancy, a divacancy, a defect complex thereof with an element constituting the semiconductor substrate, a dislocation, a rare gas element such as helium or neon, or a metal element such as platinum. The lifetime of the carriers is reduced by the lifetime killer 36 in the diode section 80 and in the vicinity of the boundary of the diode section 80 and the transistor section 70. This can improve a reverse recovery characteristic of the diode section 80, and additionally suppress crowding of the carriers in the vicinity of the boundary to thereby improve switching withstand capability with respect to a turn-off, a reverse recovery, a short-circuit and so on.

The lifetime killer 36 may extend from the diode section 80 to the transistor section 70. The position of an end of the lifetime killer 36 on the transistor section 70 side may be more inside the transistor section 70 than a boundary of the collector region 22 and the cathode region 82. Further, the lifetime killer 36 may be formed at a lower portion of the dummy trench portion 30. The lifetime killer 36 may not need to be formed at the lower portion of the gate trench portion 40.

Figure 3:
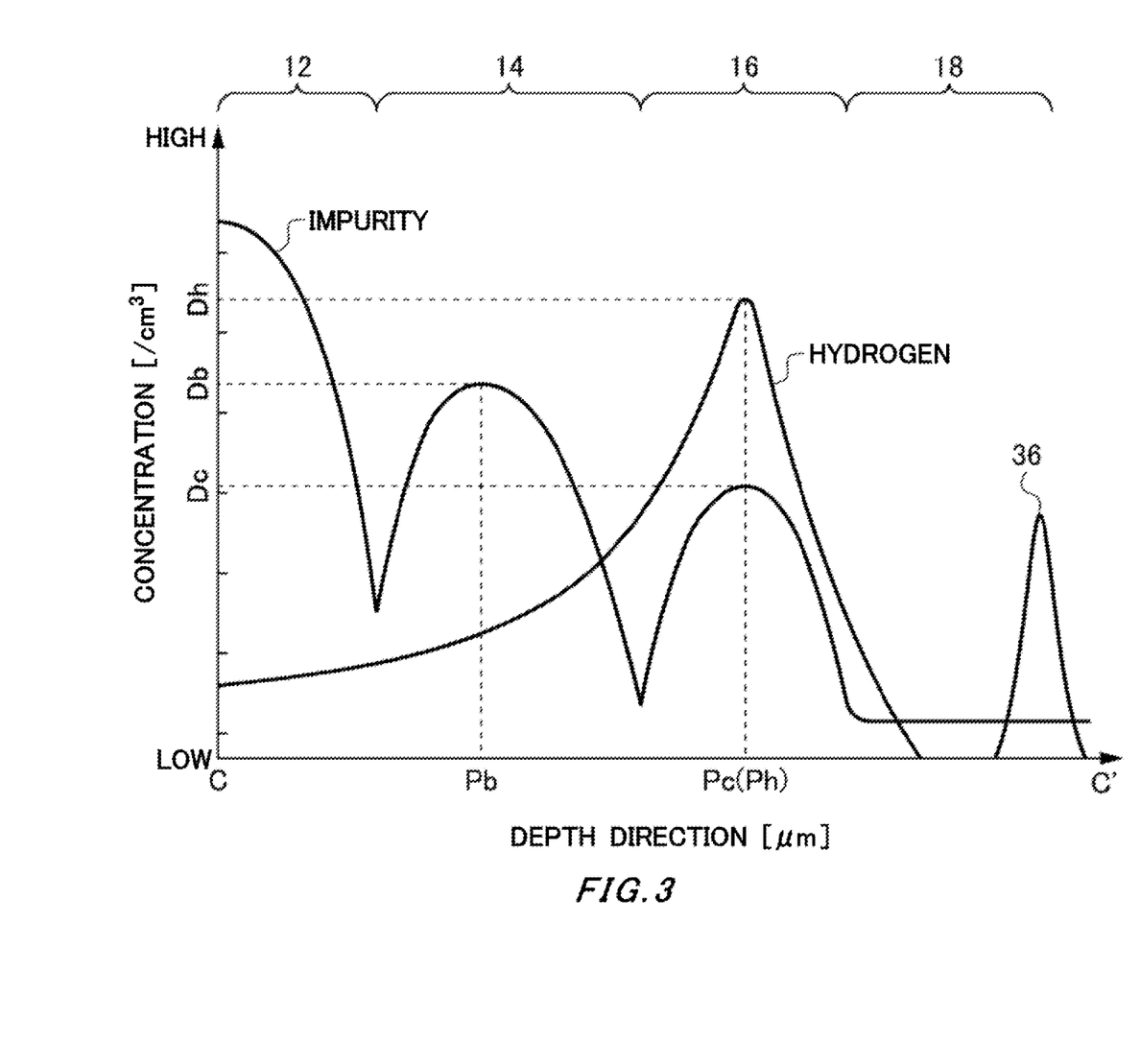
FIG. 3 is a drawing showing one example of concentration distributions of impurities and hydrogen in a cross-section c-c' of FIG. 2.

FIG. 3 is a drawing showing one example of concentration distributions of impurities and hydrogen in a cross-section c-c' of FIG. 2. In FIG. 3, a concentration distribution from the emitter region 12 in the transistor section 70 to the upper end of the drift region 18 is shown. As shown in FIG.

3, the vertical axis in a drawing showing a concentration of impurities or hydrogen is a logarithmic axis. One graduation in the vertical axis indicates ten times thereof.

In this specification, a doping concentration refers to a concentration of impurities transformed to donors or acceptors. The doping concentration shown in FIG. 3 corresponds to a difference between concentrations of donors and acceptors. Also, the hydrogen concentration in this specification refers to a concentration including hydrogen not transformed to donors as well as hydrogen transformed to donors.

Among the hydrogen implanted into the semiconductor substrate 10, the accumulation region 16 has hydrogen transformed to donors at a predetermined donor transformation rate as the impurity. As one example, the donor transformation rate of hydrogen is about 0.1% to 10%. For this reason, hydrogen having a concentration of about ten times or more and one thousand times or less the doping concentration that the accumulation region 16 is to have is implanted into the accumulation region 16. The values of the doping concentration and the hydrogen concentration in the accumulation region 16 may use peak values Dc and Dh.

In the depth direction, a peak position in the doping concentration distribution of the accumulation region 16 is denoted as Pc and a peak position in the hydrogen concentration distribution is denoted as Ph. Since the accumulation region 16 of the present example has the hydrogen transformed to donors as the impurity, the peak position Pc generally matches with the peak position Ph.

Also, the base region 14 may also contain hydrogen. The hydrogen contained in the base region 14 may not need to be transformed to donors. By virtue of the hydrogen (or protons) implanted into the base region 14, defects in the base region 14 can be terminated to recover the defects.

When hydrogen is transformed to donors at a predetermined donor transformation rate, a concentration of hydrogen contained in the base region 14 is such that the conductivity type of the base region 14 is not inverted. The hydrogen concentration distribution in the depth direction of the present example is gradually decreased from the peak position Ph to the upper surface of the semiconductor substrate 10. A hydrogen concentration in a peak position Pb of the doping concentration in the base region 14 may be lower than a peak value Db of the doping concentration in the base region 14. The hydrogen concentration in the present example is 10% or less of the peak value Db of the doping concentration.

Note that a peak position in the concentration of the lifetime killer 36 may be located at a position not overlapping with a peak position (Ph) of the hydrogen concentration. In point defects including in particular vacancies of the lifetime killer 36, dangling bonds are terminated by hydrogen, so that the lifetime may increase; thus, the termination effect can be suppressed by shifting of the peak position. The peak position in the concentration of the lifetime killer 36 may be located at a position not overlapping with the peak position Pc of the accumulation region.

Figure 4:
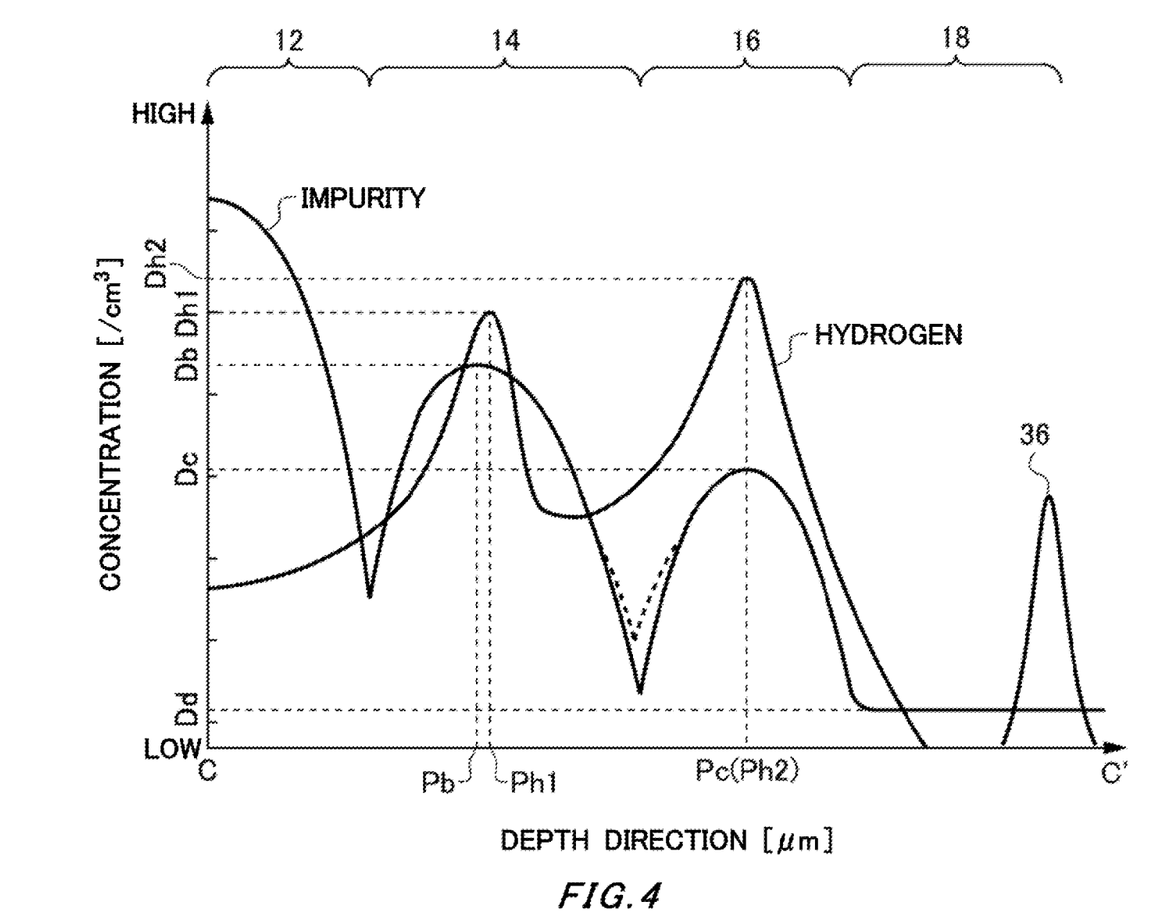
FIG. 4 is a drawing showing another example of concentration distributions of impurities and hydrogen in a cross-section c-c' of FIG. 2.

FIG. 4 is a drawing showing another example of concentration distributions of impurities and hydrogen in a cross-section c-c' of FIG. 2. In the present example, the hydrogen concentration distribution in the depth direction may have peaks in both of the base region 14 and the accumulation region 16. The hydrogen concentration distribution in the accumulation region 16 is similar to the hydrogen concentration distribution in the accumulation region 16 shown in FIG. 3. In the present example, protons are implanted against the semiconductor substrate 10 by two ranges having different depths to form two peaks in the hydrogen concentration distribution.

In the present example, a peak value Dh2 of the hydrogen concentration distribution in the accumulation region 16 may be higher than a peak value Dh1 of the hydrogen concentration distribution in the base region 14. In this way, while the conductivity type of the base region 14 is suppressed from being inverted into n type, a relatively high doping concentration can be achieved in the accumulation region 16. Note that on condition that the conductivity type of the base region 14 is not inverted into n type, the peak value Dh1 of the hydrogen concentration distribution in the base region 14 may be higher than the peak value Dh2 of the hydrogen concentration distribution in the accumulation region 16.

Also, in the depth direction, the peak position Pb of the doping concentration in the base region 14 may match with a peak position Ph1 of the hydrogen concentration distribution in the base region 14. A relatively large number of defects are formed at the peak position Pb of the doping concentration in the base region 14; thus, when the peak of the hydrogen concentration distribution is arranged at that position, the defects in the base region 14 can be recovered with high efficiency. Note that the peak positions Ph1 and Pb may have an error of about ±0.1 μm or less in the depth direction.

Also, the peak value Dh1 of the hydrogen concentration distribution in the base region 14 is higher than the doping concentration Dd in the drift region 18. The doping concentration Dd in the drift region 18 may be an average value of the doping concentration in the drift region 18. When the hydrogen concentration in the base region 14 is brought relatively higher, a large number of defects in the base region 14 can be recovered.

Also, the peak value Dh1 in the hydrogen concentration distribution in the base region 14 may be larger than the peak value Db of the doping concentration distribution in the base region 14. When the hydrogen concentration is increased more, more defects can be recovered. Note that the peak value Dh1 of the hydrogen concentration has a dimension in an extent that the conductivity type of the base region 14 is not inverted into n type. As one example, the peak value Dh1 of the hydrogen concentration may be smaller than ten times of the peak value Db of the doping concentration, may be smaller than five times thereof, and may be smaller than twice thereof. Alternately, the peak value Dh1 of the hydrogen concentration distribution in the base region 14 may be smaller than the peak value Db of the doping concentration distribution in the base region 14.

Also, a peak width of the hydrogen concentration distribution in the base region 14 may be smaller than a peak width of the doping concentration distribution in the base region 14. The peak width of the concentration distribution refers to, for example, a width in the depth direction in which a concentration is one-tenth or more of the peak value. That is, a peak of the hydrogen concentration distribution in the base region 14 may be steeper than a peak of the doping concentration distribution in the base region 14.

Note that the doping concentration in the vicinity of a pn junction between the base region 14 and the accumulation region 16 may be higher than the doping concentration of the drift region 18 as shown by a dotted line. Also, the doping concentration distribution on the base region 14 side of the accumulation region 16 may include a predetermined width in the depth direction at a concentration lower than the peak concentration of the accumulation region 16. In this case, it may include a kink in which a concentration gradient is decreased. In this way, an increase in electric field in the vicinity of the pn junction between the base region 14 and the accumulation region 16 can be suppressed.

Figure 5:
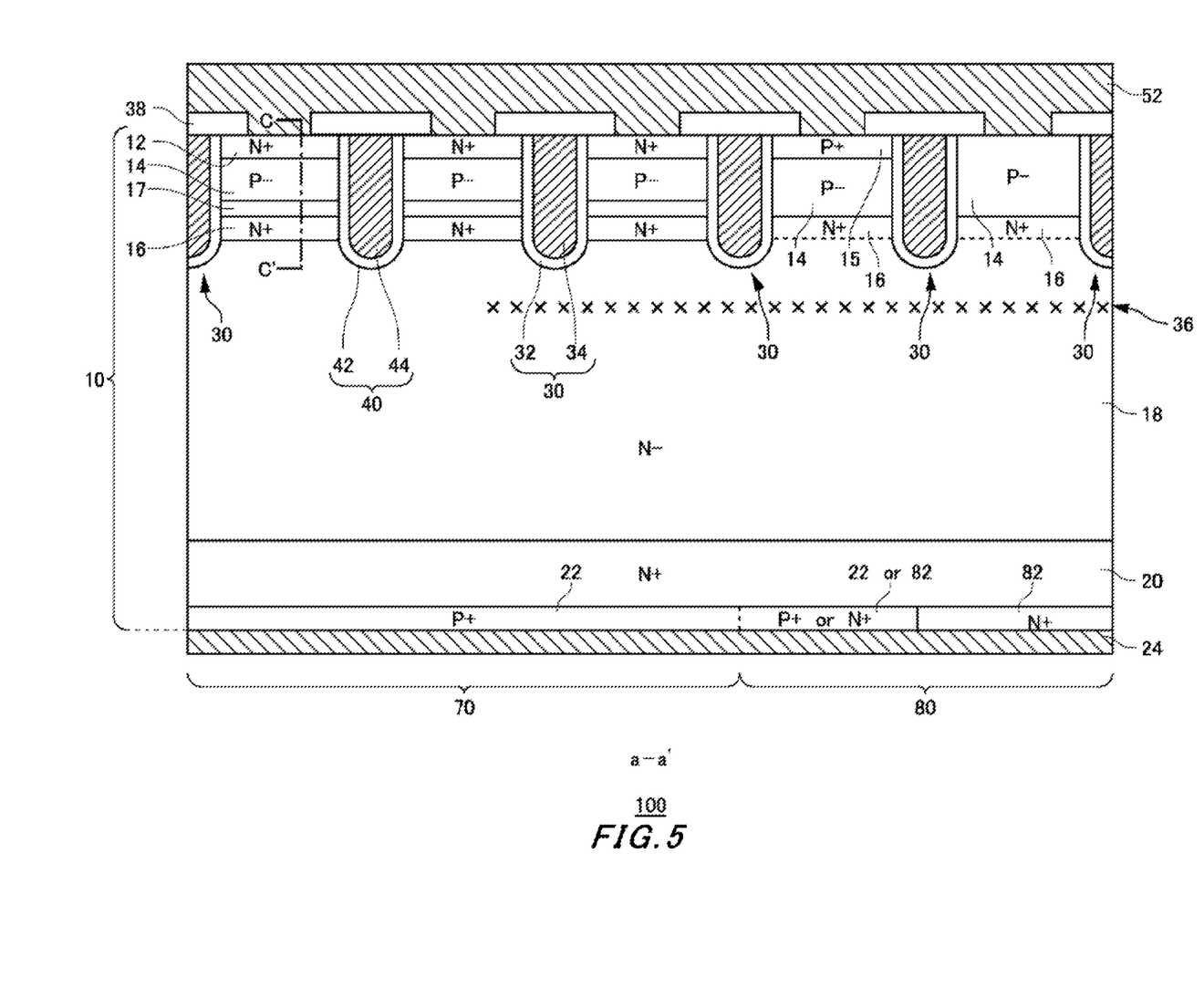
FIG. 5 is a diagram showing another example in a cross-section a-a' of FIG. 1.

FIG. 5 is a diagram showing another example in a cross-section a-a' in FIG. 1. The semiconductor device 100 of the present example has an intermediate region 17, having a doping concentration lower than that of the accumulation region 16, between the base region 14 and the accumulation region 16. The conductivity type of the intermediate region 17 is the same as that of the accumulation region 16.

Figure 6:
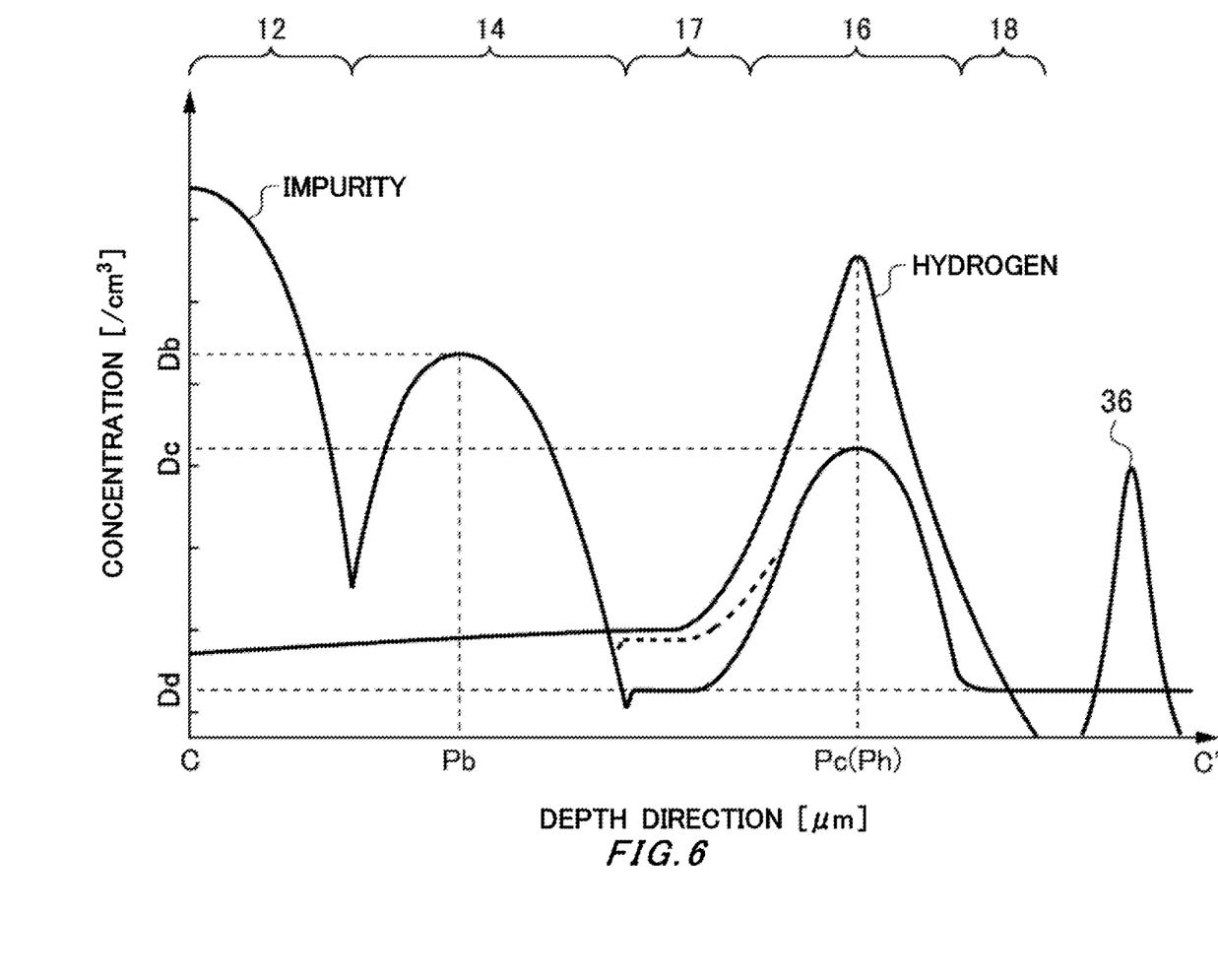
FIG. 6 is a drawing showing one example of concentration distributions of impurities and hydrogen in a cross-section c-c' of FIG. 5.

FIG. 6 is a drawing showing one example of concentration distributions of impurities and hydrogen in a cross-section c-c' of FIG. 5. In the present example, in an area between the lower end of the base region 14 and the peak position Pc of the doping concentration in the accumulation region 16, a region of which the doping concentration is smaller than ten times of the doping concentration Dd in the drift region 18 is denoted as the intermediate region 17. The doping concentration of the intermediate region 17 may be the same as the doping concentration Dd of the drift region 18. In addition, the doping concentration of the intermediate region 17 may be higher than the doping concentration Dd of the drift region 18.

For example, the intermediate region 17 can be formed such that protons are implanted at a position away from the base region 14 so that the drift region 18 remains between the base region 14 and the accumulation region 16. Protons can be easily implanted at a deep position of the semiconductor substrate 10. For this reason, the accumulation region 16 having hydrogen as impurities can be easily formed at a deep position of the semiconductor substrate 10.

When the depth position of the accumulation region 16 is shifted toward a base region 14 side due to variation in manufacturing or the like, the threshold voltage of the semiconductor device 100 will vary. On the other hand, the arrangement of the intermediate region 17 can suppress the variation of the threshold voltage even when the depth position of the accumulation region 16 is shifted toward the base region 14 side.

Note that the doping concentration in the vicinity of a pn junction between the base region 14 and the accumulation region 16 may be higher than the doping concentration of the drift region 18 as shown by a dotted line. Also, the doping concentration distribution on the base region 14 side of the accumulation region 16 may include a predetermined width in the depth direction at a concentration lower than the peak concentration of the accumulation region 16. In this case, it may include a kink in which a concentration gradient is decreased. In this way, an increase in field intensity in the vicinity of the pn junction between the base region 14 and the accumulation region 16 can be suppressed.

Figure 7:
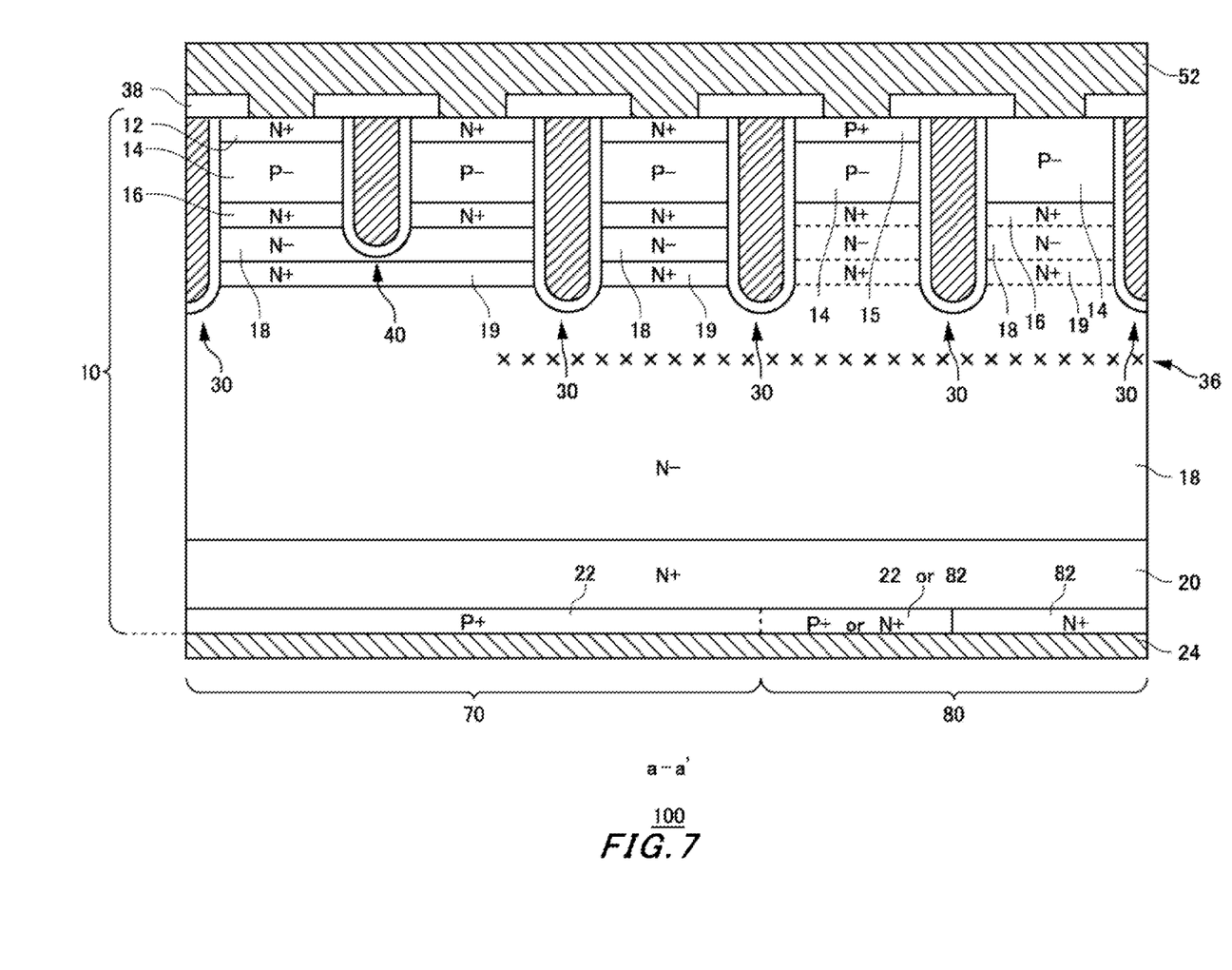
FIG. 7 is a drawing showing another example in the cross-section a-a' of FIG. 1.

FIG. 7 is a drawing showing another example in the cross-section a-a' in FIG. 1. The dummy trench portion 30 of the present example is formed to a position deeper than the gate trench portion 40. Also, the semiconductor device 100 of the present example has a high concentration region 19, formed on a side lower than the lower end of the gate trench portion 40, between the two dummy trench portions 30.

The high concentration region 19 is a region of N+ type having a doping concentration higher than that of the drift region 18. The high concentration region 19 may have a peak value of the same doping concentration as that of the accumulation region 16, and may have a peak value of the doping concentration higher than that of the accumulation region 16.

The high concentration region 19 contains hydrogen as an impurity. Similarly to the accumulation region 16, the high concentration region 19 may be formed by implantation of protons and activation thereof. When the high concentration region 19 is formed by the proton implantation, the high concentration region 19 can be formed at a deep position of the semiconductor substrate 10. The width of the intermediate region 17 in the depth direction may be smaller than that of the accumulation region 16.

The drift region 18 remains between the high concentration region 19 and the accumulation region 16. The intermediate region 17 may or may not be provided between the base region 14 and the accumulation region 16.

With a structure shown in FIG. 7, an electric field concentration at the lower end of the gate trench portion 40 can be relaxed. Also, a carrier accumulate effect can be improved.

Figure 8:
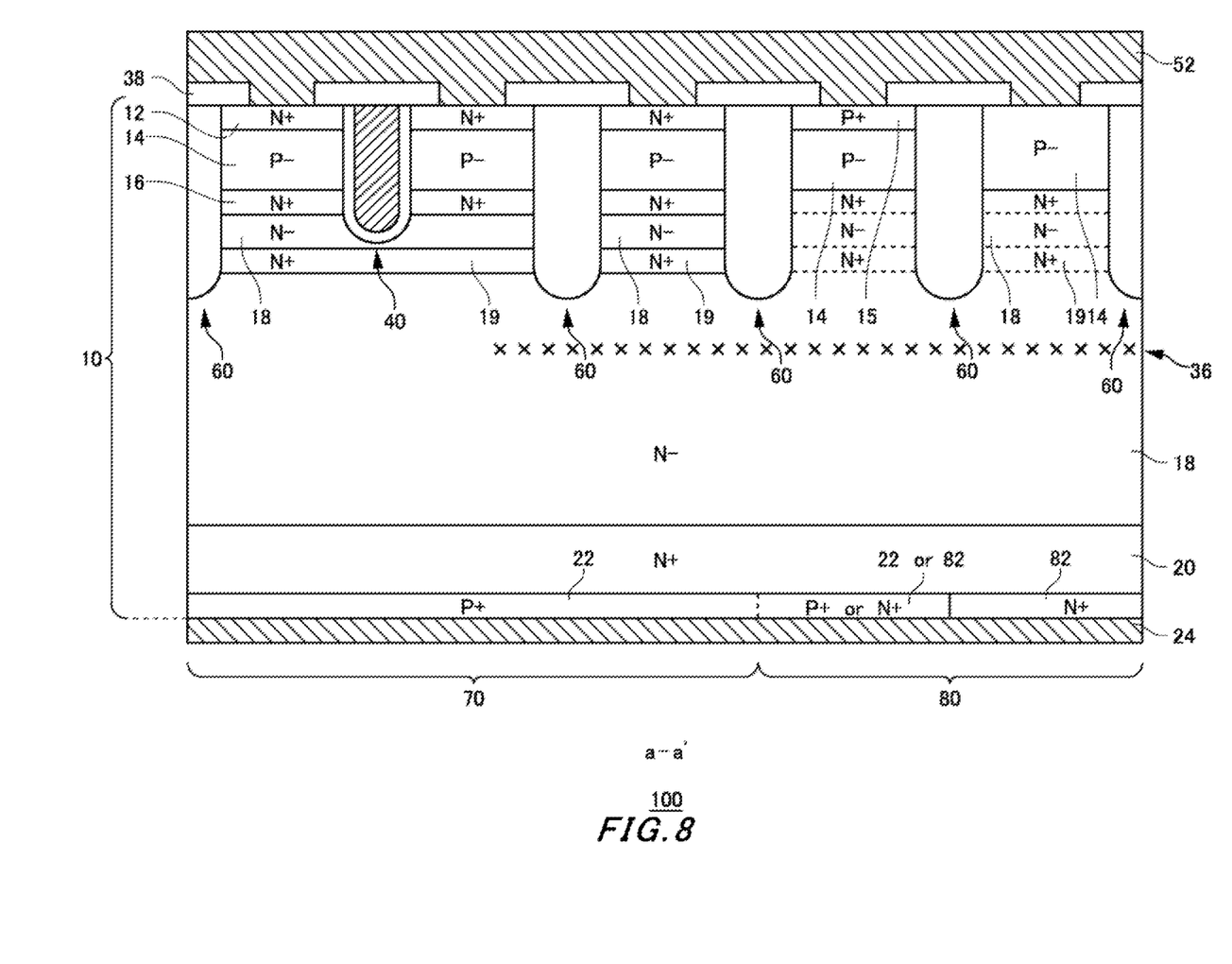
FIG. 8 is a drawing showing another example in the cross-section a-a' in FIG. 1.

FIG. 8 is a drawing showing another example in the cross-section a-a' in FIG. 1. The semiconductor device 100 of the present example has an insulating trench portion 60 instead of the dummy trench portion 30. In the insulating trench portion 60, an insulation material is filled inside the trench instead of the dummy insulating film 32 and the dummy conductive portion 34 in the dummy trench portion 30.

Other structures are the same as those in any of the semiconductor devices 100 described in FIG. 1 to FIG. 7. In FIG. 8, the dummy trench portion 30 in the semiconductor device 100 shown in FIG. 7 is replaced with the insulating trench portion 60.

Figure 9:
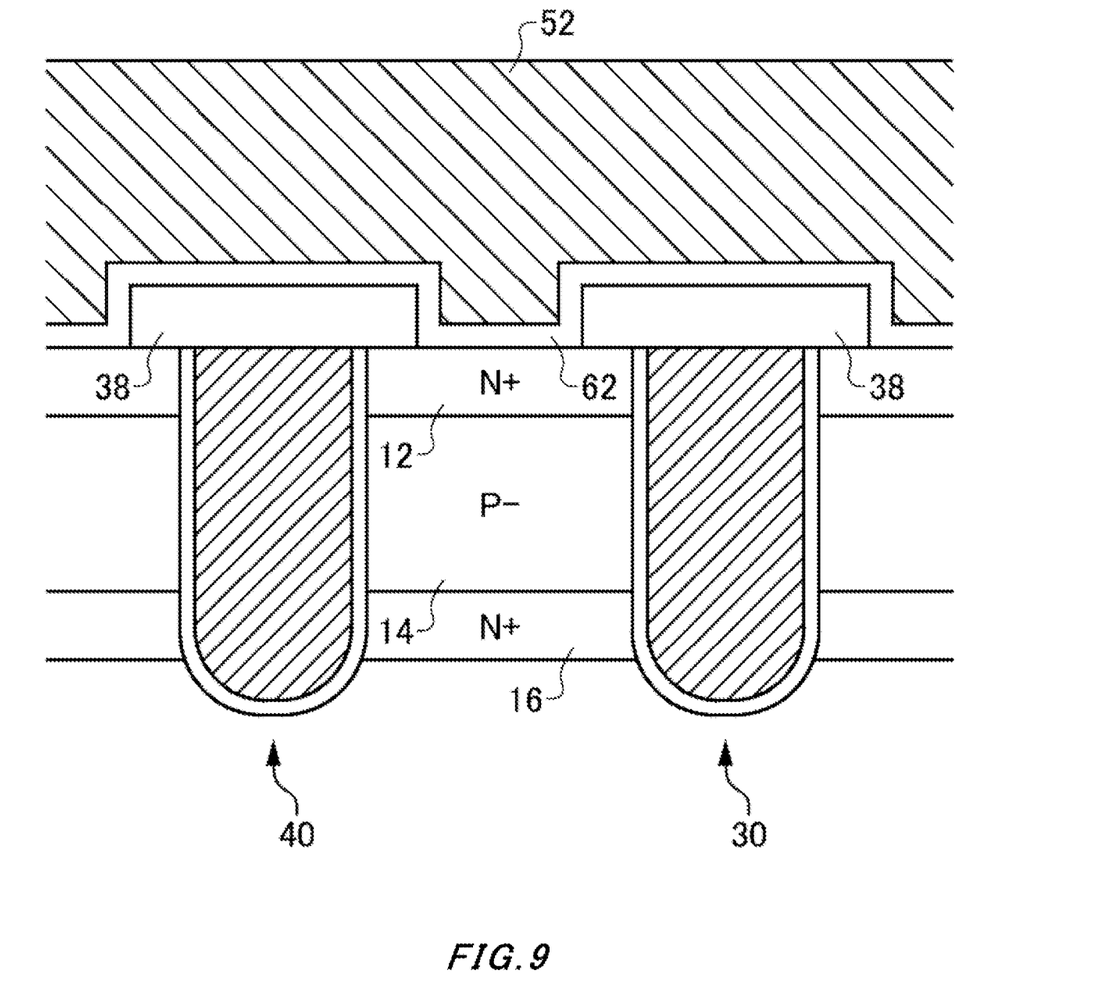
FIG. 9 is a drawing showing a part of the cross-section in the vicinity of the upper surface of a semiconductor substrate 10.

FIG. 9 is a drawing showing a part of the cross-section in the vicinity of the upper surface of the semiconductor substrate 10. The semiconductor device 100 of the present example further comprises a barrier metal 62. As one example, the barrier metal 62 includes titanium. The barrier metal 62 may be a laminated film of a titanium nitride film and a titanium film. The barrier metal 62 is formed to cover the emitter region 12 exposed on the surface of the semiconductor substrate 10 and the entire upper surface of the interlayer dielectric film 38 provided above each trench portion.

For the purpose of recovering the defects by incorporating hydrogen in the outside air into the semiconductor substrate 10, there are some cases where the barrier metal 62 on the interlayer dielectric film 38 is partially removed. On the other hand, in the semiconductor device 100, hydrogen is intentionally implanted into the accumulation region 16 and the base region 14. For this reason, without the need of the incorporation of hydrogen in the outside air, the entire upper surface of the interlayer dielectric film 38 can be covered with the barrier metal 62.

With this structure, it can be prevented that ions from a mold resin that seals the semiconductor device 100, ions from plating formed on the emitter electrode 52, or the like are incorporated into the semiconductor substrate 10 or the interlayer dielectric film 38. For this reason, characteristic variations of the semiconductor device 100 can be suppressed.

Figure 10:
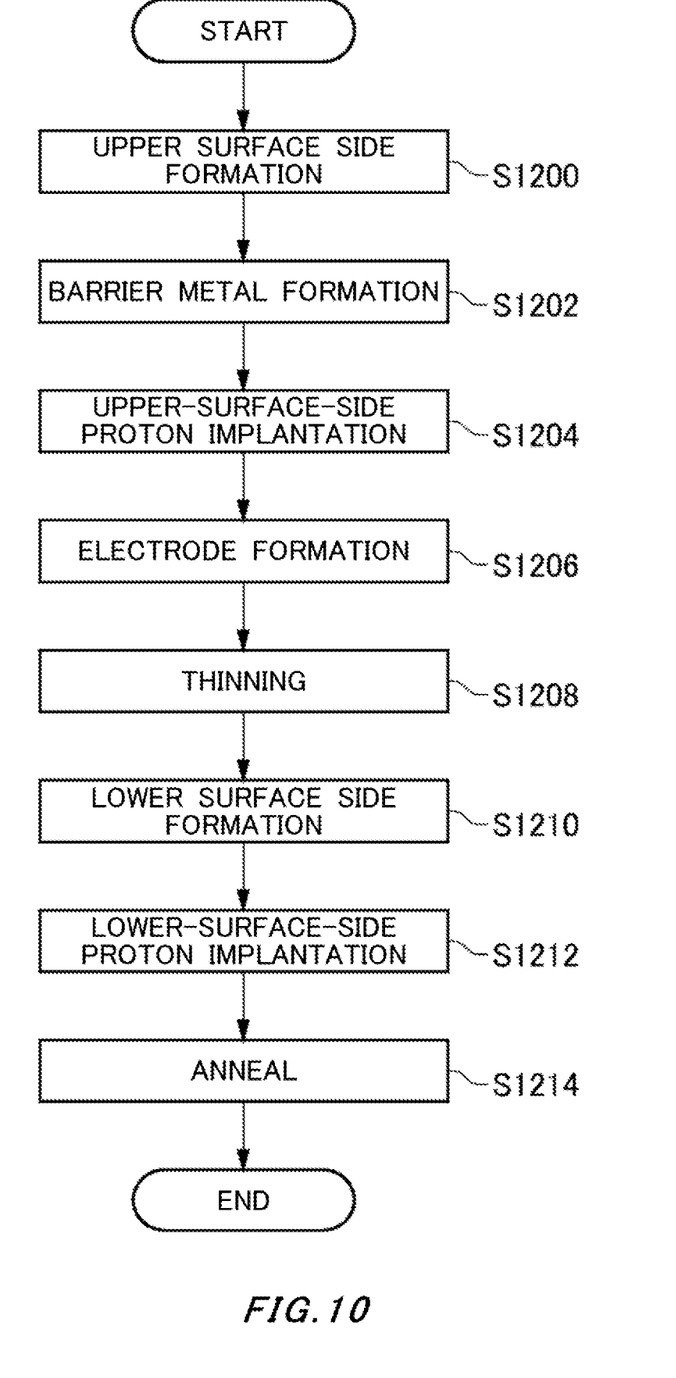
FIG. 10 is a flowchart showing one example of a manufacturing method of the semiconductor device 100.

FIG. 10 is a flowchart showing one example of a manufacturing method of the semiconductor device 100. First at process S1200, a structure on the upper surface side of the semiconductor device 100 is formed. An impurity region formation step of forming the emitter region 12 and the base region 14 is included in process S1200. Also, a trench formation step of forming each trench portion after the impurity region formation step is included in process S1200. Also, an interlayer dielectric film formation step of forming an interlayer dielectric film 38 to cover each trench portion is included in process S1200.

Next at process S1202, the barrier metal 62 is formed on the entire upper surface of the semiconductor substrate 10 and the interlayer dielectric film 38. Next at process S1204, protons are implanted from the upper surface side of the semiconductor substrate 10 to form the accumulation region 16. In a case that forms the accumulation region 16, as one example, a dose amount of protons is $1.0 \times 10^{15}/cm^2$ or more. A part of the implanted protons is transformed to donors to form the accumulation region 16. At process S1204, protons may be also implanted into the base region 14. Also, at process S1204, protons may also be implanted from the lower surface side of the semiconductor substrate 10. After the implantation of the protons, a thermal treatment may be carried out at a temperature of approximately 350 degrees C. to 450 degrees C. to activate protons.

When protons are implanted thereinto from the upper surface side of the semiconductor substrate 10 after the formation of the barrier metal 62, it can be suppressed that protons or hydrogen gets out of the upper surface side of the semiconductor substrate 10. For this reason, hydrogen is easy to remain even in the base region 14 provided at a shallow position from the upper surface of the semiconductor substrate 10, so that defects can be recovered.

Next, at process S1206, the emitter electrode 52 is formed. The formation temperature of the emitter electrode 52 is approximately 350 degrees C. to 450 degrees C. By omission of the thermal treatment after the proton implantation, protons may be activated at the time of formation of the emitter electrode 52. Note that the order of process S1204 and process S1206 may be replaced. When protons are implanted thereinto after the formation of the emitter electrode 52, it can be further suppressed that protons diffuse out of the upper surface side of the semiconductor substrate 10. Also, after the emitter electrode 52 is formed, an electron beam may be irradiated to the semiconductor substrate 10 to adjust the carrier lifetime.

Next, at process S1208, a thickness of the semiconductor substrate 10 is adjusted to grind the lower surface side of the semiconductor substrate 10. The thickness of the semiconductor substrate 10 is set according to a breakdown voltage to be involved by the semiconductor device 100.

Next, at process S1210, a structure in the lower surface side of the semiconductor device 100 is formed. The structure in the lower surface side is, for example, the collector region 22 and the cathode region 82.

Next, at process S1212, protons are implanted from the lower surface side of the semiconductor substrate 10 to form the buffer region 20.

Next, at process S1214, a thermal treatment is carried out to activate the protons implanted in the buffer region 20.

Protons may be implanted into the buffer region 20 by a plurality of times while depth positions are varied. In this way, a plurality of peaks are formed in the doping concentration distribution in the depth direction of the buffer region 20. In the doping concentration distribution of the buffer region 20, the peak value at the deepest position when viewed from the lower surface of the semiconductor substrate 10 is larger than that at the second deepest position. Also, the peak value of the doping concentration in the accumulation region 16 may be larger than any peak value of the doping concentration in the buffer region 20. Also, hydrogen (protons) may be implanted at the same timing from the lower surface side of the semiconductor substrate 10 into the base region 14 and the accumulation region 16.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The execution order of respective processes such as procedures, steps and stages in methods shown in the claims, specification, or drawings can be realized in any order as long as the order is not indicated by "prior to," "before," or the like and as long as the output from a previous process is not used in a later process. Even if the process flow is described using phrases such as "first" or "next" for convenience in the claims, embodiments, or diagrams, it does not necessarily mean that the process must be performed in this order.

What is claimed is:

1. A semiconductor device comprising:
   a semiconductor substrate;
   an emitter region of a first conductivity type provided inside the semiconductor substrate;
   a base region of a second conductivity type provided below the emitter region inside the semiconductor substrate, the base region containing hydrogen;
   an accumulation region of the first conductivity type provided below the base region inside the semiconductor substrate, and containing hydrogen as an impurity; and
   a trench portion provided to pass through the emitter region, the base region and the accumulation region from an upper surface of the semiconductor substrate.

2. The semiconductor device according to claim 1, wherein concentration distribution of hydrogen in a depth direction of the semiconductor substrate has peaks in both of the base region and the accumulation region.

3. The semiconductor device according to claim 1, wherein a peak value of a hydrogen concentration distribution in the accumulation region is higher than a peak value of a hydrogen concentration distribution in the base region.

4. The semiconductor device according to claim 1, wherein in a depth direction of the semiconductor substrate, a peak position of a doping concentration distribution in the base region coincides with a peak position of a hydrogen concentration distribution in the base region.

5. The semiconductor device according to claim 1, wherein a peak value of a hydrogen concentration distribution in the base region is higher than a peak value of a doping concentration distribution in the base region.

6. The semiconductor device according to claim 1, further comprising a drift region of the first conductivity type provided below the accumulation region inside the semiconductor substrate, and having a lower doping concentration than the emitter region,
   wherein a peak value of a hydrogen concentration distribution in the base region is higher than the doping concentration in the drift region.

7. The semiconductor device according to claim 1, wherein a concentration of hydrogen contained in the base region is a concentration such that the conductivity type of the base region is not inverted.

8. The semiconductor device according to claim 1, wherein in a depth direction of the semiconductor substrate, a peak width of a hydrogen concentration distribution in the base region is smaller than a peak width of a doping concentration distribution in the base region.

9. A semiconductor device comprising,
a semiconductor substrate;
an emitter region of a first conductivity type provided inside the semiconductor substrate;
a base region of a second conductivity type provided below the emitter region inside the semiconductor substrate;
an accumulation region of the first conductivity type provided below the base region inside the semiconductor substrate, and containing hydrogen as an impurity;
a trench portion provided to pass through the emitter region, the base region and the accumulation region from an upper surface of the semiconductor substrate; and
inside the semiconductor substrate, an intermediate region having a lower doping concentration lower than the accumulation region, between the base region and the accumulation region.

10. The semiconductor device according to claim 9, comprising a drift region of the first conductivity type provided below the accumulation region inside the semiconductor substrate and having a lower doping concentration than the emitter region,
wherein the doping concentration of the intermediate region is higher than the doping concentration of the drift region.

11. The semiconductor device according to claim 1, wherein in a depth direction of the semiconductor substrate, the base region is arranged to be in contact with the accumulation region.

12. The semiconductor device according to claim 1, further comprising:

an interlayer dielectric film provided to cover the trench portion on the upper surface of the semiconductor substrate; and
a barrier metal provided on an entire upper surface of the interlayer dielectric film above the trench portion.

13. A semiconductor device comprising:
a semiconductor substrate;
an emitter region of a first conductivity type provided inside the semiconductor substrate;
a base region of a second conductivity type provided below the emitter region inside the semiconductor substrate;
an accumulation region of the first conductivity type provided below the base region inside the semiconductor substrate, and containing hydrogen as an impurity;
a trench portion provided to pass through the emitter region, the base region and the accumulation region from an upper surface of the semiconductor substrate;
a drift region of the first conductivity type provided below the accumulation region inside the semiconductor substrate, and having a doping concentration lower than that of the emitter region; and
a lifetime killer provided closer to the upper surface side in the semiconductor substrate than a center of the drift region in a depth direction,
wherein in a depth direction of the semiconductor substrate, a peak position of a concentration of the lifetime killer is arranged at a position not overlapping with a peak position of a concentration of the hydrogen.

14. The semiconductor device according to claim 1, wherein a concentration of the hydrogen contained in the base region is lower than a peak value of the concentration of the hydrogen contained in the accumulation region.

* * * * *